Figure 1:
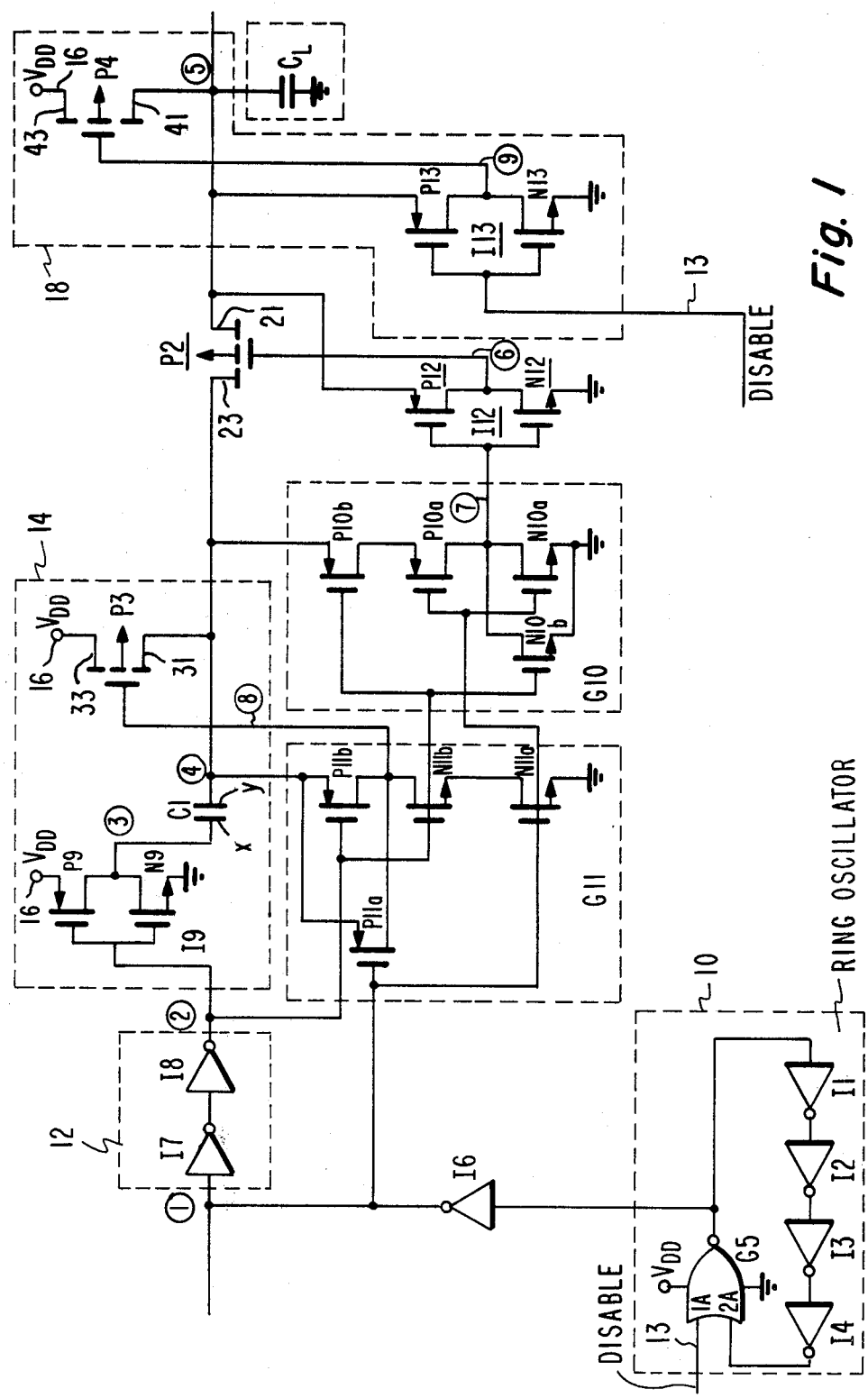

United States Patent [19]

Harmon et al.

[11] 4,344,003
[45] Aug. 10, 1982

[54] LOW POWER VOLTAGE MULTIPLIER CIRCUIT

[75] Inventors: Joseph W. Harmon, East Brunswick, N.J.; James H. Atherton, Freeport, Ill.

[73] Assignee: RCA Corporation, New York, N.Y.

[21] Appl. No.: 174,928

[22] Filed: Aug. 4, 1980

[51] Int. Cl.$^3$ .................. H02M 3/155; H03K 5/02; H03K 17/687

[52] U.S. Cl. ................ 307/296 A; 307/246; 307/264; 363/60

[58] Field of Search .......... 307/246, 296 R, 296 A, 307/474, 475; 363/58–63

[56] References Cited

U.S. PATENT DOCUMENTS

| | | | |
|---|---|---|---|
| 3,774,055 | 11/1973 | Bapat | 307/453 |
| 3,889,135 | 6/1975 | Nomiya et al. | 307/482 |
| 4,000,412 | 12/1976 | Rosenthal et al. | 307/296 A |
| 4,106,086 | 8/1978 | Holbrook et al. | 363/60 |

Primary Examiner—Larry N. Anagnos
Assistant Examiner—Tommie Peterson
Attorney, Agent, or Firm—Samuel Cohen; Henry I. Schanzer

[57] ABSTRACT

A voltage multiplier includes an inverter connected at its output to one plate of a capacitor for applying a first or a second voltage thereto, a first transistor switch which, when on, applies a second voltage to the second plate of the capacitor, and a second transistor switch which, when on, couples the second side of the capacitor to a load. For one polarity of input signal the inverter output switches from the first to the second voltage to produce an enhanced voltage at the second plate which is coupled via the second switch to the load. For the opposite polarity of input signal the inverter output switches from the second to the first voltage and the first switch is turned on. The input signal to the inverter is delayed and circuits responsive to the input signals are coupled to the first and second switches for:

(a) in response to signals of the one polarity turning off the first switch prior to the production of the enhanced voltage and the turn on of the second switch; and (b) in response to signals of opposite polarity turning off the second switch prior to the turn on of the first switch and the switching of the inverter output from the second to the first voltage.

8 Claims, 2 Drawing Figures

LOW POWER VOLTAGE MULTIPLIER CIRCUIT

This invention relates to voltage multiplying circuits.

A need exists for circuits capable of producing voltages of greater magnitude then those available from the main power supply. This need may be met by employing voltage multiplying circuits such as shown, for example, in U.S. Pat. No. 4,000,412, entitled VOLTAGE AMPLITUDE MULTIPLYING CIRCUITS issued Dec. 28, 1976. A typical such circuit includes a capacitor which is charged during one time interval by means of an inverter which connects one plate of the capacitor to a source of a first potential, and a first transistor which connects the second plate of the capacitor to a source of a second potential. Voltage multiplication is achieved by switching the inverter such that a second potential is applied to the one plate of the capacitor and concurrently turning off the first transistor. An enhanced, third, potential is then generated at the second plate which is outside the range of the first and second potentials; i.e. the potential differential between the first and third potentials is greater than the potential differential between the first and second potentials.

In a circuit such as described above undesired operations results if the first transistor is still conducting when the enhanced potential is produced. Current then flows between the second plate at which the enhanced potential is produced and the source of the second potential via the conduction path of the first transistor. This, causes the amplitude of the enhanced potential to be severely reduced due to loading via the conduction path of the first transistor. Hence, full voltage multiplication is not achieved and this is accompanied by significant power dissipation. A characteristic of this circuit is that the voltage at the second plate of the capacitor switches between the second potential (during recharge) and the enhanced potential. Where the load must be maintained at or near the enhanced voltage, it must be coupled to the second plate when the enhanced voltage is produced and must be decoupled from the second plate prior to and during recharge.

Voltage multiplying circuits embodying the invention include means responsive to the application of signals to the inverter for turning off the first transistor prior to the production of the enhanced voltage at the second plate of the capacitor. Circuits embodying the invention may also include a second transistor switch connected between the second plate of the capacitor and a load and means for turning on the second transistor after the turn off of the first transistor and the production of the enhanced voltage. The circuit also includes means for turning off the second transistor prior to the turn on of the first transistor to decouple the load from the capacitor when the first transistor is on.

Figure 2:
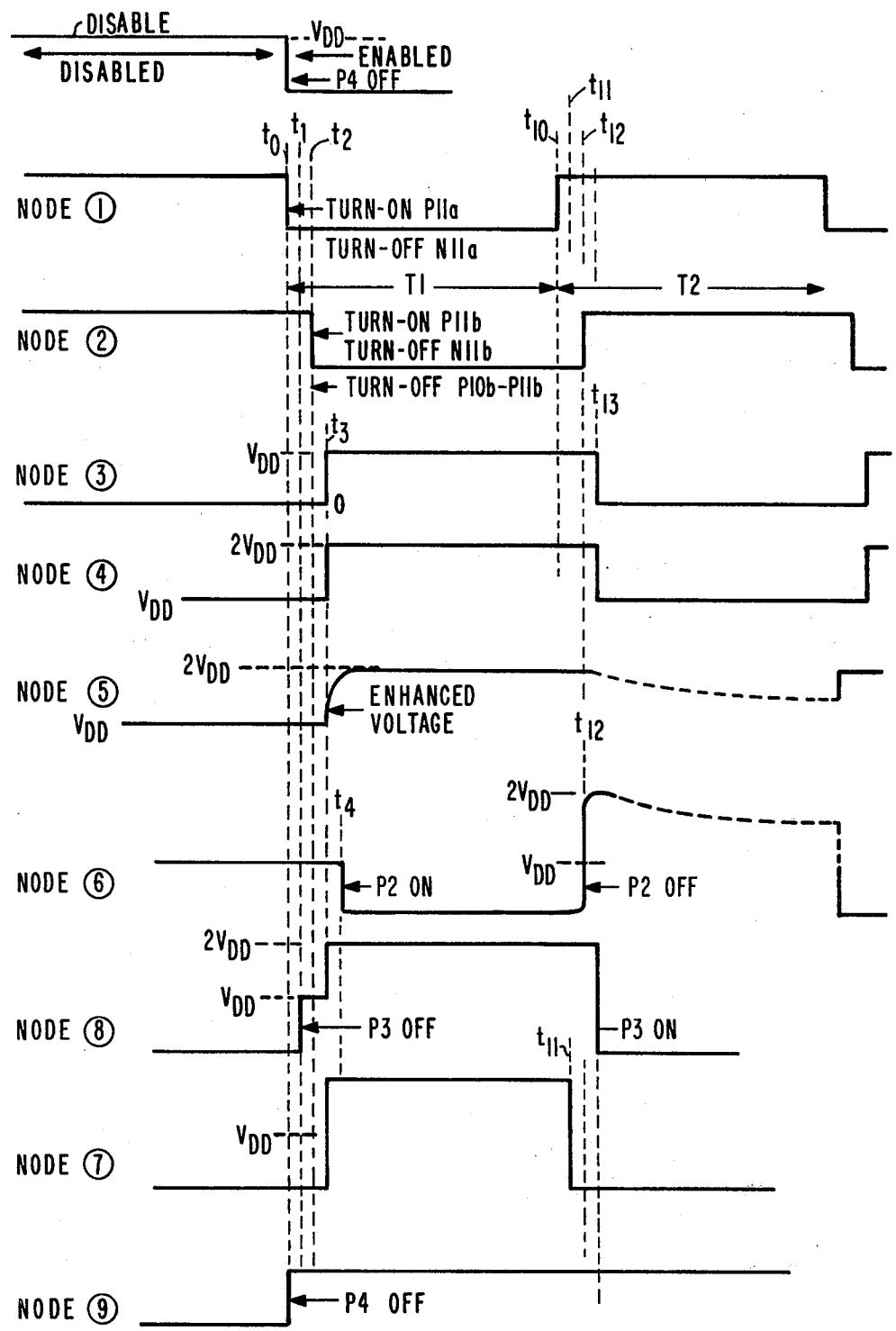

In the accompanying drawings like reference characters denote like components; and FIG. 1 is a diagram, partially in schematic and partially in block form, of a circuit embodying the invention; and FIG. 2 is a diagram of waveforms associated with various nodes of the circuit of FIG. 1.

In the discussion to follow, it will be convenient to discuss operation in Boolean terms. The convention arbitrarily adopted is that the more positive voltages ("high") used in the system represent the binary digit "1" and the less positive voltages ("low") represent the binary digit "0". To further simplify the explanation of the circuit operation, it will sometimes be stated that a "1" or a "0" is applied to the circuit or obtained from a circuit rather than stating that a voltage which is indicative of a "1" or a "0" is applied to or derived from a circuit. To still further simplify the explanation, it will sometimes be stated that an input or output is high or low rather than stating that the signal at the input terminal or the signal at the output terminal is high or low.

The active devices which are preferred for use in practicing the invention are those of a class known in the art as insulated-gate field-effect transistors (IGFETS). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference numeral; and enhancement type IGFETs of N-conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude than a given value, which is defined as the threshold voltage ($V_T$) of the transistor. To turn on a P type transistor its gate voltage ($V_G$) has to be more negative than its source voltage ($V_S$) by at least $V_T$. To turn on an N-type transistor its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

The circuit of FIG. 1 includes a ring oscillator 10, comprised of inverters I1, I2, I3, I4 and a two-input NOR gate G5. One (1A) input of G5 is connected to line 13 receptive of a "DISABLE" signal and the other input (2A) of C5 is connected to the output of I4. Inverters I1 through I4 are connected in cascade between the output of G5 and the input (2) of G5. The output of G5 is connected to the input of an inverter I6 and the output of I6 is connected to node 1 which is the input of a delay network 12. Delay network 12 is comprised of two inverters, I7 and I8, connected in cascade between nodes 1 and 2. The delay network 12 functions to ensure that the signal at node 2 is delayed by two (2) time delays relative to the signal at node 1. The significance of this delay is explained below.

A voltage multiplying section 14 connected at its input to node 2 is comprised of an inverter I9, a capacitor C1, and a transistor switch P3. I9 is a complementary inverter comprised of transistors P9 and N9. The source of P9 is connected to terminal 16 to which is applied $V_{DD}$ volts and the source of N9 is returned to ground. The gate electrodes of P9 and N9, which define the input of I9, are connected to node 2. The drains of P9 and N9, which define the output of I9, are connected to node 3. Capacitor C1 is connected between nodes 3 and 4. The value of the capacitor is dependent on the amount of charge it is necessary to apply to utilization circuits (not shown) connected to an output node 5. The capacitor may be an integrated, on chip, component or a discrete, off chip, component. In the discussion to follow, the terminal, side, or plate of capacitor C1 connected to node 3 will be referred to as plate X or "X" the terminal, side, or plate connected to node 4 will be referred to as plate Y or "Y". The conduction path of P3 is connected between terminal 16 to which is applied $V_{DD}$ volts and node 4, while its gate electrode is connected to the output of a two-input NAND gate G11 at node 8. The two inputs (1 and 2) of gate G11 are connected to nodes 1 and 2, respectively, and in response to the signals at the nodes G11 controls the turn on and turn off of transistor P3. The conduction path of a transistor P2 is connected between node 4, which functions as the output of the voltage multiplying section, and output terminal node 5. The turn on and turn off of P2 is controlled by means of a two-input NOR gate G10 and an inverter I12. The two inputs (1 and 2) of G10 are connected to nodes 1 and 2, respectively, and its output is connected to node 7. Inverter I12 includes complementary transistors P12 and N12 whose gate electrodes (which define the input of I12) are connected to node 7. The source electrode of P12 is connected to node 5, the source of N12 is returned to ground, and the drains of P12 and N12 which define the output of I12, are connected to node 6 and the gate electrode of P2. A load which is shown as a capacitor $C_L$ is connected between node 5 and ground.

A clamp circuit 18 for maintaining node 5 at $V_{DD}$ volts when a "high" DISABLE signal is applied to line 13 includes a transistor P4 and an inverter I13 comprised of transistors P13 and N13. The conduction path of P4 is connected between terminal 16 and node 5, and its gate electrode is connected to a node 9 to which is connected the drains of P13 and N13 defining the output of I13. The conduction path of P13 is connected between nodes 5 and 9 while the conduction path of N13 is connected between node 9 and ground. Thus, the operating potential for inverter I13 is the potential between node 5 and ground. The gate electrodes of N13 and P13 are connected to line 13 to which is applied the DISABLE signal.

Inverters I1, I2, I3, I4, I6, I7, and I8 may be inverters of the complementary conductivity type like I9, or any other suitable type of inverter. The operating potentials applied to inverters I1 through I4, gate G5, and inverters I6 through I9 are $V_{DD}$ and ground. The operating potentials for gates G10 and G11 are the potentials (V4) at node 4 and ground. The operating potentials for inverters I12 and I13 is the potential (V5) at node 5 and ground. The significance of operating different parts at different voltages is discussed below.

In the discussion to follow, reference is made to the propagation and time delays of the logic gates and inverters. In general, there is a time delay ($\tau d$) in the propagation of a signal through a logic gate or an inverter. That is, there is a delay between the time an input signal is applied to the input of a logic gate or inverter and a later time when an output signal responsive to the input is produced at the output of the logic gate or inverter. In the discussion to follow, for ease of explanation, it is assumed that the logic gates and inverters used in the circuit, have a time delay ($\tau d$).

The circuit of FIG. 1 is in the "DISABLED" condition when the DISABLE signal is at $V_{DD}$ volts [logic "1" or "high"]. For the DISABLE=High condition, oscillator 10 is inhibited and the output of NOR gate G5 is at, or close to, 0 volt [logic "0" or "low"] and the voltages V1 and V2 at nodes 1 and 2, respectively are "high". When V2 is high the voltage (V3) at node 3 is at, or close to, 0 volt. Therefore, plate X of capacitor C1 is at ground or 0 volts. With V1 and V2 at $V_{DD}$ volts, transistor P11a and P11b of gate G11 are turned off while transistors N11b and N11a are turned on. Consequently, node 8 is clamped to ground via the series conduction paths of N11a and N11b and transistor P3 is turned on. Then, node 4, which is also plate Y of capacitor C1 is charged to $V_{DD}$ volts via the conduction path of P3. With V1 and V2 high, transistors P10a and P10b of G10 are turned off while transistors N10a and N10b are turned on and node 7 is clamped to ground potential. With node 7 grounded N12 is turned off and P12 is turned on. The turn on of P12 provides a low impedance conduction path between nodes 5 and 6 which functions to keep P2 turned off as explained below.

When the DISABLE signal is at $V_{DD}$ volts, transistor N13 or I13 is turned on, clamping node 9 and the gate electrode of P4 to ground potential. P4 is then turned on hard and node 5 is clamped to $V_{DD}$ volts. Since node 5 is at $V_{DD}$ volts and since P12 is turned on (as discussed above) it couples $V_{DD}$ volts via its conduction path to the gate electrode of P2. Hence, P2 with $V_{DD}$ volts at its source, drain, and gate is non-conducting and no current can flow into a load at terminal 5. Thus, though P3 is on, P2 is off, node 4 is decoupled from node 5, and there is no power dissipation during the time the circuit is disabled. However, recall that during the "DISABLED" mode, capacitor C1 is charged with plate X at 0 volts and plate Y at $V_{DD}$ volts. Therefore, capacitor C1 is primed to develop an enhanced (multiplied) voltage as described below.

The operation of the circuit of FIG. 1 in the "ENABLED" mode, which mode occurs when the DISABLE signal goes (and stays at) low (0 volts), is now discussed.

First, for the duration of the "ENABLED" mode (DISABLE=low), clamp P4 is turned off. A low applied to line 13 turns off N13 and turns on P13 whose source-to-drain conduction path is connected between node 5 and the gate electrode of P4. In the "ENABLED" mode, as described below, the potential (V5) at node 5 will be at, or above, $V_{DD}$ volts. Electrode 41 of P4 connected to node 5 then functions as the source electrode of P4. Hence, the turn on of P13 ensures that P4 is turned off. With P4 off, the clamp circuit 18 does not effect the voltage at node 5 and/or the voltage multiplication of the circuit.

The operation of the ring oscillator 10 is known and need not be greatly detailed. Suffice it to say that while the DISABLE signal applied to input 1A of G5 is "high" the output of G5 is "low". Then, the output of I1 is high, the output of I2 is low, the output of I3 is high and the output of I4 is low. Thus, just prior to the DIS- ABLE signal going low, the signal applied to input 2A of G5 is low. Therefore, when the DISABLE signal goes "low" the two signal inputs to G5 go low and the output of G5 then goes high. Subsequently, the high at the output of G5 is propagated via I1, I2, I3 and I4 such that at some time ($t_{10}$ in FIG. 2), which time depends on the delays of the oscillator components, input 2A of G5 goes high and the output of G5 goes low. The low is then again propagated around the I1-I4 loop causing the output 2A of G5 to go low and output of G5 to, again, go high. Hence, after the DISABLE signal goes low, G5 functions as an inverter, and the ring oscillator circuit is enabled with the output of G5 oscillating between $V_{DD}$ and ground. During one portion (T1) of each cycle the output of G5 is low ($\approx 0$ volts) and during the subsequent portion (T2) of each cycle the output of G5 is high ($\approx V_{DD}$ volts). The response of the circuit to the periodic transitions generated by the oscillator 10 are best explained with reference to FIG. 2. For ease of description, propagation delays of signals along the circuit are measured from the time node 1 goes low or high.

When the DISABLE signal applied to G5 goes "low" the output of G5 goes "high" causing the output of I6 to drive node 1 to the "low" level as shown at time $t_0$ for node 1 in FIG. 2.

The negative going transition at node 1 is simultaneously applied to one input of gates G11 and G10 and to the input of inverter 17. Whenever node 1 makes a transition (e.g. from high to low) node 2 will make a like transition (e.g. from high to low) two (2) time delays ($2\tau d$) later as shown for node 2 in FIG. 2

The prepagation delay between nodes 1 and 2 ensures that the output of G11 at node 8 is first driven high, to turn off P3, and that only subsequently thereto is the output of G10 at node 7 driven high to then cause node 6 to be driven low and P2 to be turned on, as detailed below. As soon as V1 goes low, transistor P11a of G11 is turned on and node 8 is clamped via the conduction path of P11a to node 4. Since node 4 is at $V_{DD}$ volts this turns off transistor P3. With P3 turned off, node 4 can subsequently rise above $V_{DD}$ and there will be no current conduction via P3. However, since V2 is still high, N10b is turned on, node 7 remains low, node 6 remains high, and P2 remains turned off.

When node 2 goes low, at time $t_2$, $2\tau d$ after node 1 went low at time $t_0$, N9 turns off and P9 turns on whereby the output of I9 goes from 0 volts to $V_{DD}$ volts at time $t_3$, three time delays ($3\tau d$) after $t_0$. When the voltage applied to plate X of C1 goes from 0 volts to $V_{DD}$ volts, plate Y of C1, which was primed to $V_{DD}$ volts, goes from $V_{DD}$ volts to $2V_{DD}$ volts, since the voltage across a capacitor cannot change instantaneously. Electrode 31 of P3 connected to node 4 is now at $2V_{DD}$ while its electrode 33 connected to terminal 16 is at $V_{DD}$. Electrode 31 connected to node 4 now functions as the source electrode of P3. But, node 4 is coupled via the parallel conduction paths of P11a-ON and P11b-ON to the gate electrode of P3. Therefore, the potentials applied to the gate and source electrodes of P3 are at $2V_{DD}$ and P3, is cutoff and non-conducting. Thus, the turn off of P3 initiated at time $t_1$ by coupling its gate to node 4 (which was then at $V_{DD}$), is maintained when the voltage at node 4 rises to $2V_{DD}$ at time $t_3$.

When V2 goes low, at time $t_2$, the two inputs to gate G10 are driven low; N10a and N10b are turned off and P10a and P11b are turned ON and its output can then go "high". Thus at time $t_3$ node 7 rises from zero volts towards the level at node 4. As node 7 goes "high" towards $2V_{DD}$, P12 gets turned off and N12 gets turned on driving node 6 and the gate of P2 towards ground potential. P2 thus turns on approximately four time delays ($4\tau d$) after $t_0$. Therefore, P2 is turned on after P3 is turned off and after an enhanced potential is produced at node 4. The importance of this sequence is that P2 functions to couple to node 5 only the $2V_{DD}$ potential. This can only be achieved if P2 is turned on after P3 is off and after the enhanced voltage is produced at node 4. Furthermore, when the gate of P2 is clamped to ground, electrode 23 of P2 connected to node 4 which then functions as its source is at $2V_{DD}$. This causes P2 to be turned on very hard and to provide a very low impedance conduction path between nodes 4 and 5.

When transistor P2 is turned on the multiplied voltage present on capacitor C1 is coupled to output node 5 and charges the output capacitance $C_L$. The output voltage (V5) may be expressed as follows:

$$V5 = V_{DD}[1 + C1/C1 + C_L] \qquad \text{eq. 1}$$

It is evident from eq. 1 that for values of C1 significantly larger than $C_L$, V5 is approximately equal to $2V_{DD}$. Hence, the multiplied voltage is coupled without much loss to the output mode.

The circuit remains in this state until the next positive going transition of the "clock" signal applied to node 1.

Assume, as shown in FIG. 2, that a positive going transition occurs at node 1 at time $t_{10}$, and that this positive going transition appears at node 2 at time $t_{12}$; $2\tau d$ later. The delay now ensures that the output 7 of gate G10 goes low driving node 6 high and P2 off prior to the output 8 of gate G11 going low and the turn on of P3, as detailed below. The positive going transition at node 1 starts to turn off P11a and to turn on N11a but no change occurs at node 8 since transistor P11b is still turned on (N11b is off) and transistor P3 is kept turned off. The positive going transition at node 1 turns off P10a and turns on N10a causing node 7 to go low. The low at node 7 turns off N12 and turns on P12. The source-to-drain path of P12 is connected between nodes 5 and 6. Hence, when P12 is turned on the potential at node 5 which is at, or close to, $2V_{DD}$ is applied to the gate of P2. The electrode 21 of P2 which is connected to node 5 now functions as the source electrode when node 4 is subsequently clamped to $V_{DD}$ volts while node 5 remains above $V_{DD}$. Hence, in order to ensure and maintain transistor P2 turned off when node 4 is clamped to $V_{DD}$ it is important that the source-to-drain path of P12 be connected between nodes 5 and 6 (rather than nodes 4 and 6).

The turn off of P2 at time $t_{12}$ occurs while P3 is still turned off. The turn off of P2 isolates output node 5 from the internal voltage doubling node 4. Depending on the load, the voltage at node 5 can remain close to $2V_{DD}$ or else decay as a function of the leakage current at that node. When V2 goes positive at time $t_{12}$, nodes 1 and 2 are both at $+V_{DD}$ volts. P11a and P11b in gate G11 are now turned off while N11a and N11b are turned on and couple the gate electrode of P3 to ground via their turned on conduction paths. P3-ON charges node 4 and plate Y to $V_{DD}$ via its conduction path. Concurrently, the positive going transition at node 2 causes the output of inverter I9 to go low and clamp plate X of capacitor C1 to ground. Thus, at time $t_{13}$, C1 is recharged with node 4 at $V_{DD}$ volts and node 3 at, or close to, ground potential. At time $t_{12}$ transistor N10b also turns on (both transistors P10a and P10b are turned off), further clamping node 7 already driven low at time $t_{11}$ to ground. Since node 7 was already low it remains low and node 6 remains high maintaining P2 cutoff. As noted above, electrode 23 of P2 now functions as the drain electrode since it is at $V_{DD}$ volts while electrode 21 of P2 connected to node 5 is at a potential which is higher than $V_{DD}$ and functions as the source electrode.

Thus, P2 isolates the load from node 4 when the voltage at the latter is, or is about to be, clamped to $V_{DD}$ volts. This permits the voltage at node 5 to be substantially higher than the voltage at node 4 which serves as the driving point for node 5. During the remainder of the "high" cycle at node 1, the potential at node 5 may decay due to leakage currents and other loads applied to node 5. The decay will continue until the next negative going transition at node 1 when the cycle described above, for V1 going low, will be repeated.

In the circuit of FIG. 1 a voltage ($+2V_{DD}$ volts) more positive than the zero to $V_{DD}$ volts available from the main power supply is generated. It should be evident that the teachings of the invention are applicable to circuits where a voltage more negative (e.g. $(-)V_{DD}$ volts) than that available (zero-to-$V_{DD}$) from the main power supply is to be generated. For example, the voltage amplifying section 14 would be modified such that transistor P3 would be replaced by a transistor (N3) of N conductivity type connected between node 4 and ground to provide a negative going enhanced voltage. Transistor P2 would be replaced by a transistor (N2) of N conductivity type connected between nodes 4 and 5. Transistors N2 and N3 would be turned on and off by the use of similar logic gates to those shown in FIG. 1 which would have their operating voltage terminals connected between the positive power supply line and node 4. The gate of N3 would be driven by a two-input NOR gate and the signal for N2 would be derived from a two input NAND gate. Also transistor P4 would be replaced by a transistor of N conductivity type having its conduction path connected between node 5 and ground potential.

In the circuit of FIG. 1, delay network 12 is shown to include two cascaded inverters but, it should be evident that, any appropriate or known delay means could be used instead.

What is claimed is:

1. The combination comprising:
    a capacitor having first and second terminals;
    an inverter having first and second power terminals for the application thereto of first and second operating voltages, respectively, and having an input and an output;
    means connecting the output of the inverter to said first terminal of said capacitor;
    input means for applying input signals to said input of said inverter for switching the voltage produced at its output between two levels corresponding to said first and second voltages;
    first and second transistors; each transistor having first and second electrodes defining the ends of a conduction path and a control electrode;
    means connecting the conduction path of said first transistor between the second terminal of said capacitor and said second power terminal;
    means connecting the conduction path of said second transistor between said second terminal of said capacitor and a circuit output terminal;
    means responsive to said input signals, said means being coupled to the control electrodes of said first and second transistors for: (a) in response to input signals of one transition, first turning-off said first transistor, and then, secondly, switching the voltage produced at said output of said inverter from said first to said second level, and concurrently, turning-on said second transistor; and (b) in response to said input signals making a second transition opposite to said one transition, turning-off said second transistor and then turning-on said first transistor.

2. The combination as claimed in claim 1 wherein said input means for applying input signals to said inverter includes a delay network connected between a circuit input terminal and the inverter input; and
    wherein said means responsive to the input signals being applied to the input of said inverter includes:
    a two-input NAND gate and a two input NOR gate, one input from each one of said gates being connected to said circuit input terminal and the other input from each one of said gates being connected to said inverter input; each one of said gates having first and second power terminals for the application of an operating potential therebetween; and
    each one of said gates having an output, with means connecting the output of one of said gates to the control electrode of said first transistor and means connecting the output of the other one of said gates to the control electrode of said second transistor.

3. The combination as claimed in claim 2 wherein a voltage equal to said first operating voltage is applied to the first power terminals of said NOR gate and said NAND gate; and
    wherein said second power terminals of said NOR gate and said NAND gate are connected to said second terminal of said capacitor.

4. The combination as claimed in claim 3 wherein said delay network includes second and third inverters, said second inverter being connected at its input to said circuit input terminal and at its output to the input of said third inverter and said third inverter being connected at its output to said inverter input.

5. The combination as claimed in claim 1 wherein said input means for applying input signals to said input of said inverter includes a controllable oscillator having an output at which is selectively produced signals making periodic transitions between first and second voltage levels; and delay means for coupling the oscillator output to the input of said inverter.

6. The combination as claimed in claim 5 wherein said means responsive to the signal being applied to the input of said inverter includes a first logic gate coupled between said delay means and the control electrode of said first transistor for turning off said first transistor prior to the production of an enhanced potential at the other side of said capacitor and a second logic gate coupled between said delay means and the control electrode of said second transistor for turning on said second transistor after the turn off of said first transistor.

7. In a voltage multiplying circuit which includes first switch means responsive to an input signal for selectively applying a first or a second voltage level to one terminal of a capacitor and second switch means coupled between the other terminal of said capacitor and a circuit point to which is applied a voltage of a value approximately equal to said second voltage level, wherein an enhanced voltage is produced at said other terminal of the capacitor when said first switch means applies said second voltage and said second switch means is turned off, the improvement comprising:

means for applying an input signal to the first switch means;

means coupled to the second switch means responsive to the signal being applied to the first switch means for turning off the second switch means prior to the time said first switch means applies said second voltage, and for turning on said second switch means in response to an input signal causing said first switch means to apply said first voltage to said capacitor;

a third switch means connected between the other terminal of said capacitor and a circuit output terminal; and means coupled to said third switch means responsive to the signal being applied to the first switch means for turning on said third switch means following the generation of said enhanced voltage, and for turning off said third switch means prior to the turn on of said second switch means in response to said input signal causing said first switch means to apply said first voltage to said capacitor.

8. The combination comprising:

a capacitor having first and second sides;

an inverter having first and second power terminals for the application thereto of first and second operating voltages, respectively, and having an input and an output;

means connecting the output of the inverter to said first side of said capacitor;

an input terminal, for the application thereto of input signals making transitions between a first level and a second level;

a delay means connected between said input terminal and said inverter input;

first and second transistors; each transistor having first and second electrodes defining the ends of a conduction path and a control electrode;

means connecting the conduction path of said first transistor between the second side of said capacitor and said second power terminal;

means connecting the conduction path of said second transistor between the second side of said capacitor and a circuit output terminal, means coupled to the control electrode of said first and second transistors responsive to the signals at said input terminal and the delayed signals at said inverter input for, in response to signals of one transition, turning off said first transistor, and then switching the inverter output from said first to said second voltage, and turning on said second transistor; and for, in response to signals making a second transition opposite to said one transition, turning off said second transistor and then turning on said first transistor.

* * * * *

UNITED STATES PATENT AND TRADEMARK OFFICE
CERTIFICATE OF CORRECTION

PATENT NO. : 4,344,003

DATED : August 10, 1982

INVENTOR(S) : Joseph William Harmon et al.

It is certified that error appears in the above-identified patent and that said Letters Patent is hereby corrected as shown below:

Col. 2, line 58 "C5" should be --- G5 ---.

Col. 8, line 7 "signalsof" should be --- signals of ---.

Signed and Sealed this

Fourteenth Day of December 1982

[SEAL]

Attest:

GERALD J. MOSSINGHOFF

Attesting Officer   Commissioner of Patents and Trademarks